United States Patent
Yokota

(10) Patent No.: US 7,930,608 B2
(45) Date of Patent: Apr. 19, 2011

(54) CIRCUIT FOR CONTROLLING VOLTAGE FLUCTUATION IN INTEGRATED CIRCUIT

(75) Inventor: Toshihiko Yokota, Kyoto (JP)

(73) Assignee: International Business Machines Corporation, Armonk, NY (US)

( * ) Notice: Subject to any disclaimer, the term of this patent is extended or adjusted under 35 U.S.C. 154(b) by 334 days.

(21) Appl. No.: 12/035,536

(22) Filed: Feb. 22, 2008

(65) Prior Publication Data

US 2008/0209292 A1  Aug. 28, 2008

(30) Foreign Application Priority Data

Feb. 23, 2007 (JP) ................................ 2007-043509

(51) Int. Cl.
*G01R 31/28* (2006.01)
(52) U.S. Cl. ...................................................... 714/731
(58) Field of Classification Search .................. 714/727, 714/733, 731
See application file for complete search history.

(56) References Cited

U.S. PATENT DOCUMENTS

| | | | |
|---|---|---|---|
| 6,023,778 A * | 2/2000 | Li | 714/726 |
| 6,330,703 B1 * | 12/2001 | Saito et al. | 716/4 |
| 7,007,213 B2 | 2/2006 | Wang et al. | 714/729 |
| 7,023,261 B2 * | 4/2006 | Mano et al. | 327/541 |
| 7,310,057 B2 * | 12/2007 | Murata et al. | 341/101 |

FOREIGN PATENT DOCUMENTS

| | | |
|---|---|---|
| JP | 92004220294 A | 2/2006 |
| JP | 920060105620 A | 11/2006 |
| JP | 92007017236 A | 1/2007 |

\* cited by examiner

*Primary Examiner* — James C Kerveros
(74) *Attorney, Agent, or Firm* — Dennis Jung

(57) ABSTRACT

An integrated circuit for controlling voltage fluctuations. The integrated circuit includes a plurality of clock buffers and latches synchronously operated in accordance with operating clock signals distributed via the clock buffers. The circuit comprises a mechanism for performing an At Speed Test to shift data that are initially set for the latches in accordance with the operating clock signals to succeeding latches, respectively. It also has a timing designation circuit for enabling a clock signal pulse when a first output signal pulse is active. In addition, it includes a ring-type oscillator to consume current in the period during which the first output signal is active. The ring-type oscillator includes a delay control input terminal. The oscillation cycle of the ring-type oscillator is selectively adjusted by adjusting an input of the delay control input terminal.

17 Claims, 7 Drawing Sheets

CIRCUIT FOR CONTROLLING VOLTAGE FLUCTUATION IN INTEGRATED CIRCUIT

BACKGROUND OF THE INVENTION

1. Field of the Invention

The present invention relates to a circuit for controlling voltage fluctuation in an integrated circuit. The present invention relates particularly to a circuit and a method for preventing voltage fluctuation that occurs when an At Speed Test is conducted for a synchronous integrated circuit that includes an At Speed Testing mechanism.

2. Description of Background

At present, the mainstream of integrated circuits is a so-called synchronous integrated circuit (has various names such as an LSI, an LSI device, an LSI chip, a VLSI and an ASIC (Application Specific Integrated Circuit)) that includes a plurality of latches (also called flip-flops) and synchronously operates the latches in accordance with operating clock signals distributed in a tree form from a single clock source that is formed of a PLL through a plurality of clock buffers.

In order to perform functional tests for the integrated circuits at shipping, conventionally, the integrated circuits are constituted by incorporating therein additional circuits for performing tests, for example, for scan path of latches, as well as logics (logic circuits) for performing actual functions of the integrated circuits.

In this case, an external test signal is generally provided by an LSI tester, from outside the integrated circuit. But also widely employed is a BIST (Built-In Self Test) method, whereby a circuit for automatically generating a test signal is incorporated in an integrated circuit to be tested, so as to eliminate the external input of the test signal and to thereby reduce the testing cost.

It is preferable that the functional test at shipping be performed in an environment wherein the operating speed (i.e., the frequency of an operating clock signal) is the same as the original operating speed at which the integrated circuit is actually to be operated. In order to satisfy this preference, currently there has begun to be used an "At Speed Test" method, whereby the function of the logic circuit of an integrated circuit is tested by operating the integrated circuit at the actual operating speed, or at a somewhat similar speed, as that at which it normally would be operated.

An example arrangement for an integrated circuit that performs an At Speed Test is shown in prior art FIG. 1. Inside an integrated circuit 100, all latches 110, 112 and 114 are driven in synchronization with operating clock signals 108 transmitted by a PLL (Phase Locked Loop) 102, which is a clock supply source, via clock buffers 104 and 106. Data input terminals 116, 118 and 120 and latch output terminals 122, 124 and 126 of the latches 110, 112 and 114 are connected to a combinational circuit network 128 formed of logic gates, so that connections are established, via the combinational circuit network 128, between input signals 130, 132 and 134 from outside the integrated circuit 100 and the data input terminals 116, 118 and 120 of the latches, between the latch outputs 122, 124 and 126 and the data input terminals 116, 118 and 120, and between the latch output terminals 122, 124 and 126 and output signals 136, 138 and 140 to outside the integrated circuit 100.

The integrated circuit 100 is so constituted that data for the latches 110, 112 and 114 can be set not only through the normal input terminals 116, 118 and 120, but also through scan-in input terminals 142, 144 and 146. And when the latch output terminals are sequentially connected to the scan-in input terminals of different latches, as in a chain, a scan path is formed from a scan-in terminal 148 to a scan-out terminal 150, which covers all the latches of the integrated circuit 100.

With the above described arrangement, the basic At Speed Test processing includes the three following phases: (1) a scan-in phase; (2) a launch-capture phase; and (3) a scan-out phase.

Prior art FIG. 2 is a diagram showing a timing relationship after the integrated circuit 100 has been powered on and has passed through the individual phases of the At Speed Test and has begun to operate normally, and also showing the states of operating clock signals.

When a power voltage Vdd is applied to the integrated circuit 100, first, a scan-in phase 202 is started. During the scan-in phase 202, the latches 110, 112 and 114 accept input data transmitted by the scan-in input terminals 142, 144 and 146, and do not accept input data transmitted by the data input terminals 116, 118 and 120. In this phase, the shift register operation is performed using a scan clock signal (not shown) transmitted to the individual latches, i.e., data in series is set for the latches on the scan patch, beginning with the scan-in terminal 148, until finally, the initial data required to perform a functional test has been set for all the latches 110, 112 and 114 on the scan path. When the scan-in phase 202 has ended, data is no longer accepted from the scan-in input terminals 142, 144 and 146.

Sequentially, the launch-capture phase 204 is started. A signal SE 210 and a signal IR 212 are timing signals to be externally supplied by a tester for the At Speed Test. The signal SE 210 indicates that in the active state the launch-capture phase 204 has been effective, and the signal IR 212 is a pulse signal indicating the start of the launch-capture phase 204. The PLL 102 detects the entry of the At Speed Test into the launch-capture phase, and in the middle of this phase, outputs, as the operating clock signal OSC 208, several cycles (generally, two cycles) of clock pulses for the actual operating speed (the actual operating frequency). As a result, each time the clock pulses are output, the initial data that were set for the individual latches in the scan-in phase 202 are shifted to the connected latches at the succeeding stages. That is, each time the clock pulse is output, each latch captures, via several combinational gates, new data that is launched by (or released from) the preceding latch.

In the last scan-out phase 206, the shift register operation along the scan path is again rendered active, and the last data that were set for the individual latches in the launch-capture phase 204 are sequentially read, in series, from the scan-out terminal 150. The data are compared with expected value data that are prepared outside the integrated circuit 100. When the data match for all the latches, the At Speed Test is determined to have been successful, or when the data, even for one latch, do not match, the test is determined to have failed.

As described above, to perform the At Speed Test, after a specific period has elapsed following the start of the launch-capture phase 204, several cycles of clock pulses for the actual operating speed are suddenly provided for all the latches in the integrated circuit. Therefore, the values held by many latches in the integrated circuit 100 are simultaneously toggled (inverted). When such fast clock pulses are supplied to the individual latches, a large amount of current suddenly flows in and out of the integrated circuit 100. As a result, there is an increased current change (a so-called di/dt) per unit hour for all the paths in the integrated circuit 100 that supply a power voltage Vdd and a ground voltage GND, and there is a sharp fluctuation in the power voltage, especially evidenced by a voltage drop, inside the integrated circuit 100.

The problem posed by the fluctuation of the power voltage Vdd is more serious for the wire bonding part than for the input/output terminals (Area I/O) of the integrated circuit 100. For the wire bonding part, since the power voltage Vdd is supplied directly to the pads of the core chip of the integrated circuit 100 with very fine wires, the inductance value is very great. Therefore, when a large current change occurs, a large fluctuation in the power voltage Vdd also occurs.

Because of this voltage drop, the internal signal transmission speed of the integrated circuit is considerably reduced, and the internal circuits 100 may erroneously operate, with the result that some integrated circuits may not pass the At Speed Test. As described above, since the test is conducted under unrealistic and severe conditions that are not encountered during normal operation, a so-called "overkill" problem may occur and an actually "good" item determined to be a "defective" item, and the reliability and effectiveness of the At Speed Test greatly deteriorated.

In order to avoid the above described erroneous operation due to a power voltage drop that occurs during the At Speed Test, the following methods have been employed. According to one of the proposed methods, a pattern of the initial data that are set for individual latches during the scan-in phase is devised, so that the toggling of the values of the stored data occurs for only a reduced number of latches during the launch-capture phase. However, in this case, the testing period is extended, and the supply of patterns to be set for the initial data is limited. Thus, for the effectiveness of the test a problem still remains, such as the range of the test coverage.

According to another method, an integrated circuit to be tested is divided into a plurality of logic groups, and for each logic group, the At Speed Test is conducted for the logic circuits that belong to that group. In this manner, the amount of current flowing across the power voltage terminals throughout the entire integrated circuit is reduced, and consequently, a voltage drop due to a change in the current can be controlled.

For example, U.S. Pat. No. 7,007,213 discloses an invention which employs the method conducted based on division with the self test. This invention is a testing technique for an integrated circuit that includes a plurality of clock domains (i.e., logic groups), that employs the BIST (Built-In Self Test) method to perform the At Speed Test for the individual clock domains, and to detect a failure present in each clock domain and a failure present across the clock domains.

However, one of the problems of this method is that establishing a method for the division of an integrated circuit is difficult.

Furthermore, when an integrated circuit is divided into logic groups, an automatic inspection performed by operating a logic circuit for an operating clock can not actually be performed for the exchange of signals by the groups. Further, when the number of logic groups is increased, the test coverage is reduced.

In addition, a test circuit for performing such a division, and a test circuit for generating the pulse of an operating clock in a launch-capture phase at a different timing for each group, must be additionally provided. However, these circuits are complicated, and the generation and insertion of such circuits is very difficult.

The most important problem is that a test pattern, which is a pair of an initial data value to be set for each latch and an expected value for after the test, must be created using a conventional automatic test pattern generation tool (an ATPG tool), and controlling an ATPG tool is very difficult.

Consequently, it is desirable to provide a circuit that can solve the prior art problems as discussed above including the problem of voltage fluctuations which lead to reliability issues and erroneous operations of the circuit.

SUMMARY OF THE INVENTION

The shortcomings of the prior art are overcome and additional advantages are provided through the provision of a method and related integrated circuit for controlling voltage fluctuations. The integrated circuit includes a plurality of clock buffers and a plurality of latches synchronously operated in accordance with operating clock signals distributed via the clock buffers. The circuit comprises a mechanism for performing an At Speed Test to shift data that are initially set for the latches in accordance with the operating clock signals to succeeding latches, respectively. It also has a timing designation circuit for generating a first output signal that is active for a period from a predetermined time, which is after the integrated circuit is powered on and before an operating clock signal for the At Speed Test is generated, to a time when the operating clock signal is generated. In addition, it also includes a current consumption circuit provided in correspondence with each of at least a part of the plurality of clock buffers, for consuming a certain amount of current in the period during which the first output signal is active.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DESCRIPTION OF THE INVENTION

Figure 1:
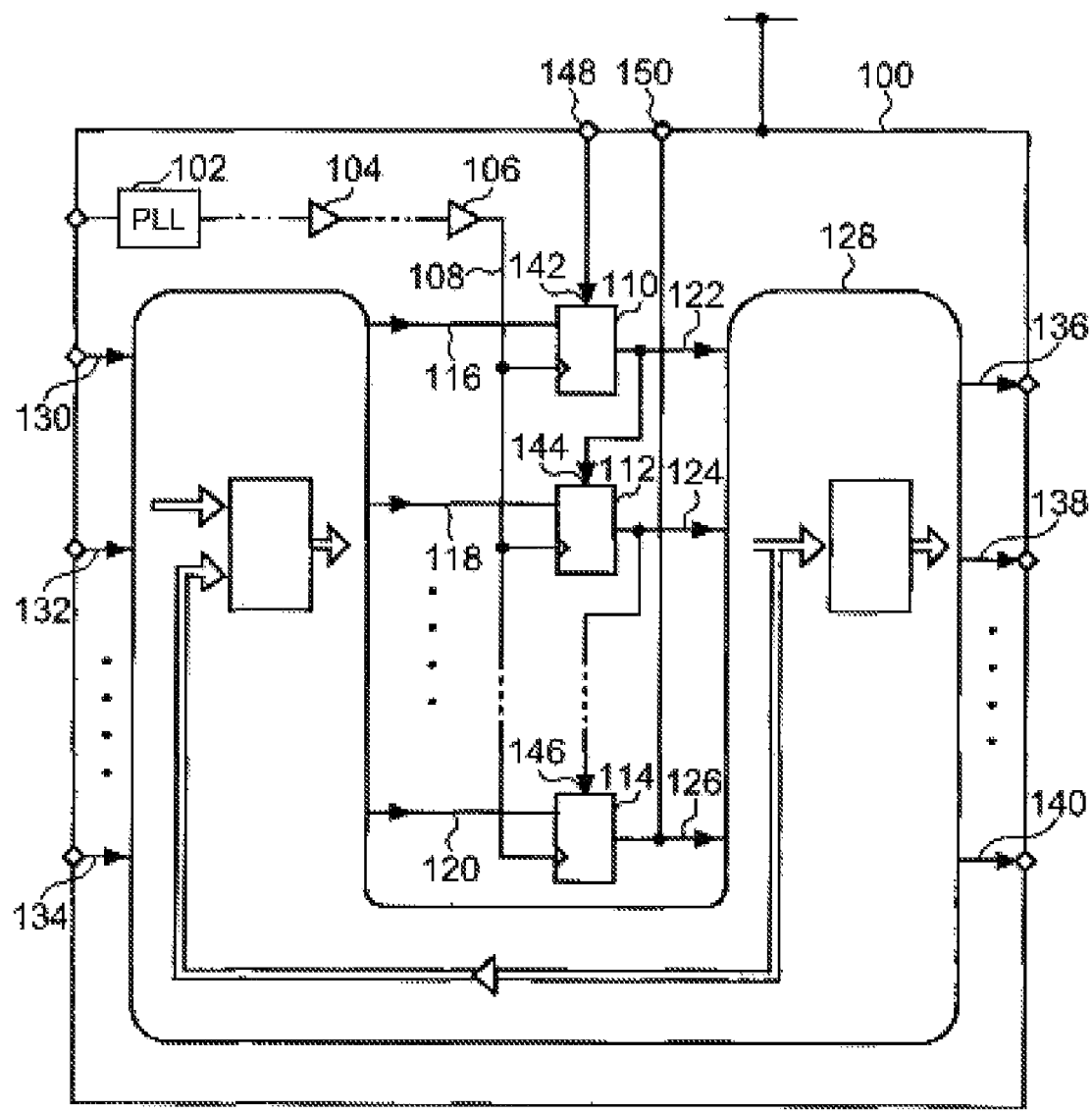
FIG. 1 is a prior art diagram showing an example configuration of an integrated circuit that performs an At Speed Test.
Figure 2:
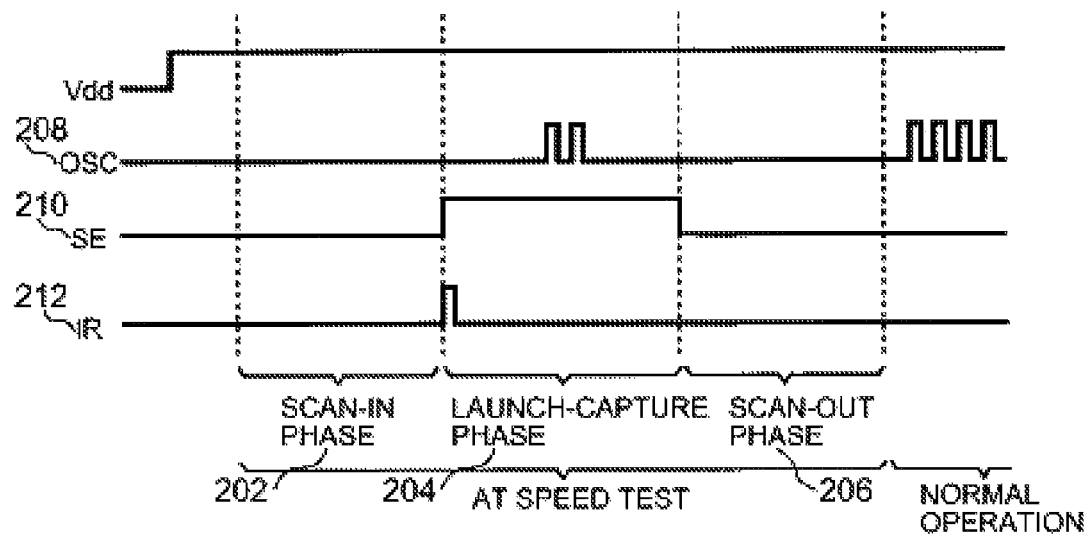
FIG. 2 is a prior art timing chart showing a relationship of timings, through the individual phases of the At Speed Test, beginning after the integrated circuit is powered on and continuing until the start of the normal operation.
Figure 3:
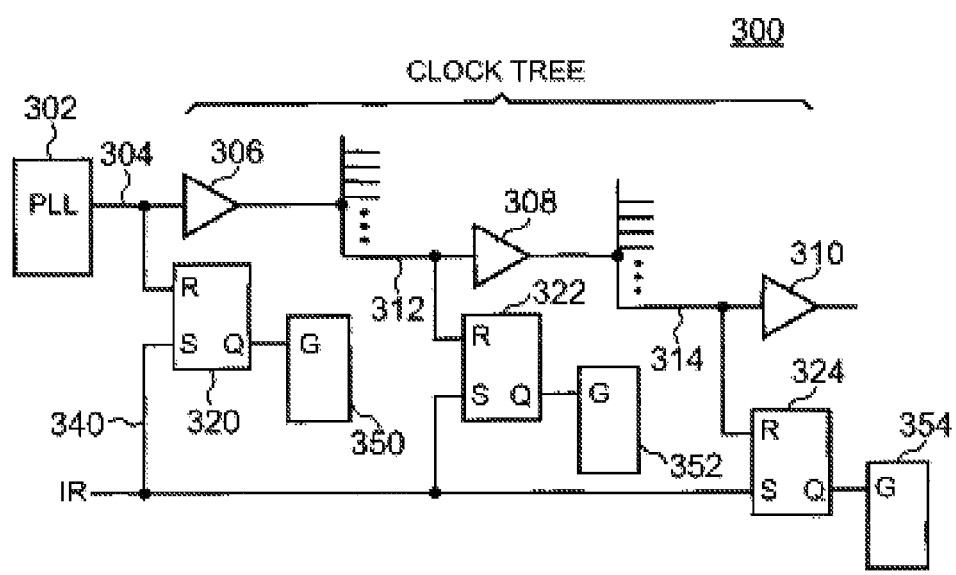
FIG. 3 is a diagram showing the arrangement of a circuit according to a first embodiment of the present invention.

FIG. 3 is a diagram showing the internal circuit configuration for an integrated circuit 300 according to the first embodiment of the present invention. That is, this circuit configuration is additionally provided for the configuration of an integrated circuit shown in FIG. 1 that includes an At Speed Test mechanism.

An operating clock signal 304, generated by a PLL 302 that is a clock supply source, is branched, by clock buffers 306, 308 and 310, in order to obtain multiple clock signals 312 and 314 in order to be inputted in all of the latches of the integrated circuit 300. The clock signals that are branched to obtain the multiple signals that are distributed to the latches are generically called a clock tree.

Set/reset latches (SR latches; also called SR flip-flops) 320, 322 and 324 are allocated respectively to the clock buffers 306, 308 and 310 that form the clock tree. The set/reset latch 320 serves as a timing designation circuit that, as will be described later, generates an output signal that is active for a period from a predetermined time, which is after the integrated circuit 300 is powered on and before the operating clock signal 304, 312 or 314 for the At Speed Test are generated, to a time when the operating clock signal is generated.

Further, current consumption circuits 350, 352 and 354, each of which consume a certain amount of current during a period wherein the output of the set/reset latch 320 is active, are provided in correspondence with the set/reset latches 320, 322 and 324, respectively.

A signal IR 340 is transmitted to a set input terminal S of the set/reset latch 320. The signal IR 340 is a pulse signal that is basically supplied by a tester provided outside the integrated circuit 300, in order to perform the At Speed Test, and that is generated at the start of a launch-capture phase 204 of the At Speed Test. When the signal IR 340 is rendered active, the set/reset latch 320 is set, and its latch output Q becomes active.

The clock signal 304 in the clock tree that is supplied by the PLL 302 is transmitted to a reset input terminal R of the set/reset latch 320. The PLL 302 is so controlled that it does not generate an operating clock signal during a scan-in phase 202 of the At Speed Test after power Vdd is supplied to the integrated circuit 300. But when the scan-in phase 202 has ended and after a predetermined time has elapsed from the start of the launch-capture phase 204, i.e., in the middle of the launch-capture phase 204, the PLL 302 generates several cycles (basically, two cycles) of pulses using the operating clock signal. Thereafter, the PLL 302 is so controlled that it does not generate an operating clock signal in the period during which the launch-capture phase 204 is ended and the At Speed Test is in a scan-out phase 206.

Therefore, in the middle of the launch-capture phase 204 during which the first pulse of the operating clock signal for several cycles is generated, the set/reset latch 320 is reset, and the latch output Q is rendered inactive.

Figure 4:
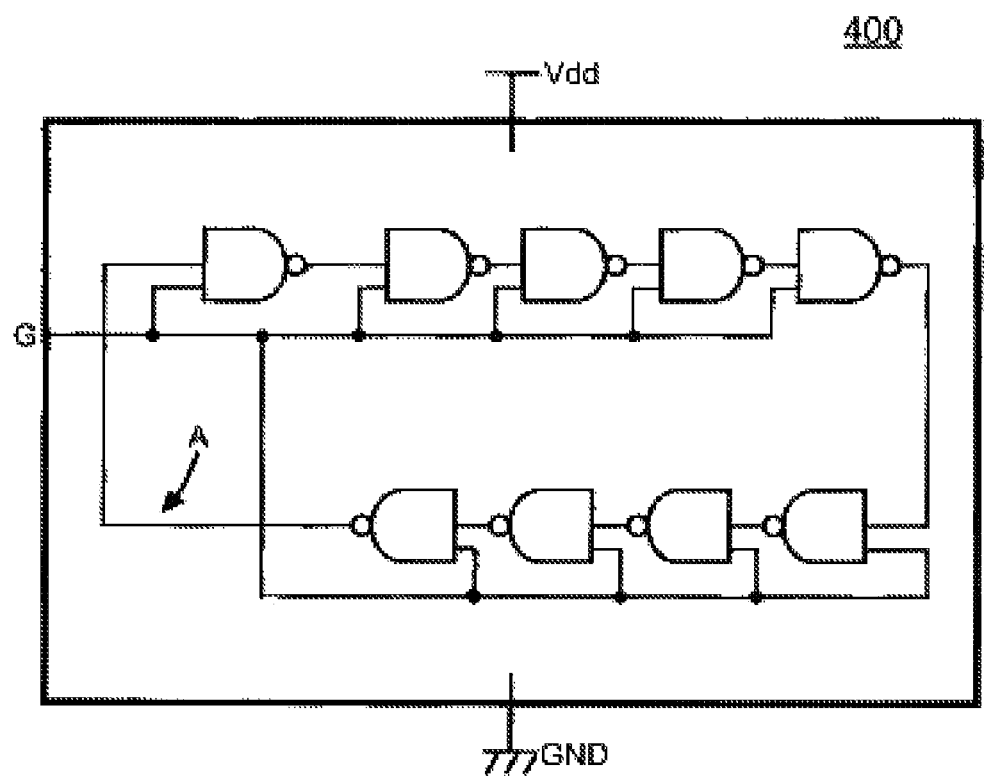
FIG. 4 is a diagram showing a circuit configuration for a ring-type oscillator according to the first embodiment of the invention.

The latch output Q is transmitted to an enable input terminal G of the current consumption circuit 350. FIG. 4 is a diagram showing the circuit configuration of a ring-type oscillator 400 that is an example for the current consumption circuit 350 of the first embodiment of the present invention. Odd numbered NAND gates, i.e., nine NAND gates, are connected in a ring-shape arrangement (looped) to constitute an oscillation circuit. All the NAND gates are off during a period in which the enable input G is inactive. When the enable input G is rendered active, the oscillation circuit formed by the ring-shape arrangement of the nine NAND gates becomes effective, individual signals, such as a signal A, on the ring-shape arrangement are prepared for oscillation, and a certain amount of current flows from the power source Vdd to the GND. As a result, the entire ring-type oscillator 400 consumes a predetermined amount of current. That is, immediately before the pulse of an operating clock signal for the At Speed Test is supplied to the each latch of the integrated circuit 300, the ring-shape arrangement of each oscillator 400, arranged in correspondence with each clock buffer, is operated, i.e., oscillated, to forcibly cause a current to flow from the power source Vdd to the GND. Therefore, the electric status wherein the pulse of the operating clock signal, for the At Speed Test, is similar to the actual status during normal operation, and the deterioration of the test quality, accompanied by the fluctuation of the power voltage Vdd, can be prevented.

Figure 5:
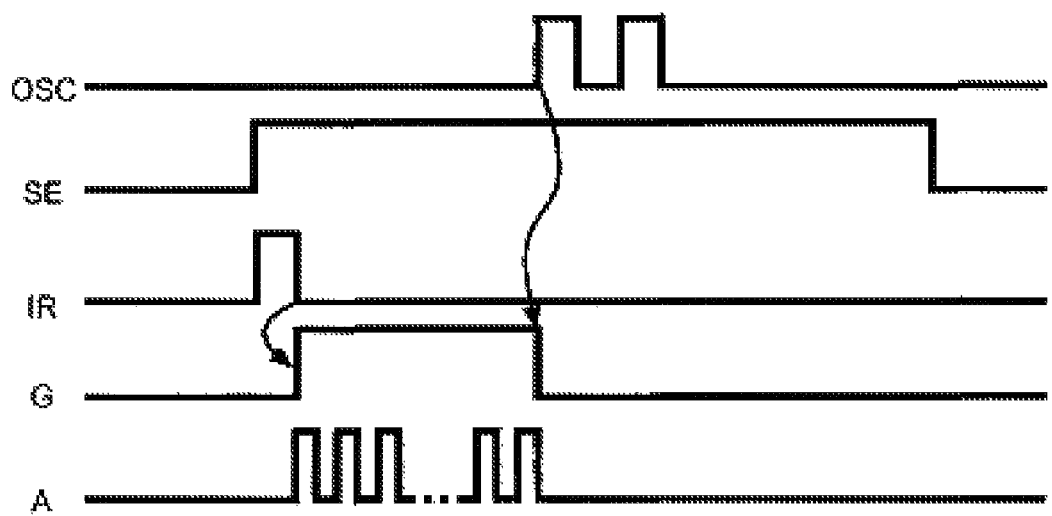
FIG. 5 is a timing chart for the main signals for the circuit according to the first embodiment of the invention.

FIG. 5 is a timing diagram for the main signals used for the circuits shown in FIGS. 3 and 4. The enable input G is active during a period beginning when the signal IR is rendered active and continuing until the first pulse of the operating clock signal has arrived. Since the ring-type oscillator 400 oscillates during this period, the signal A on the ring is in an oscillated state.

Figure 6:
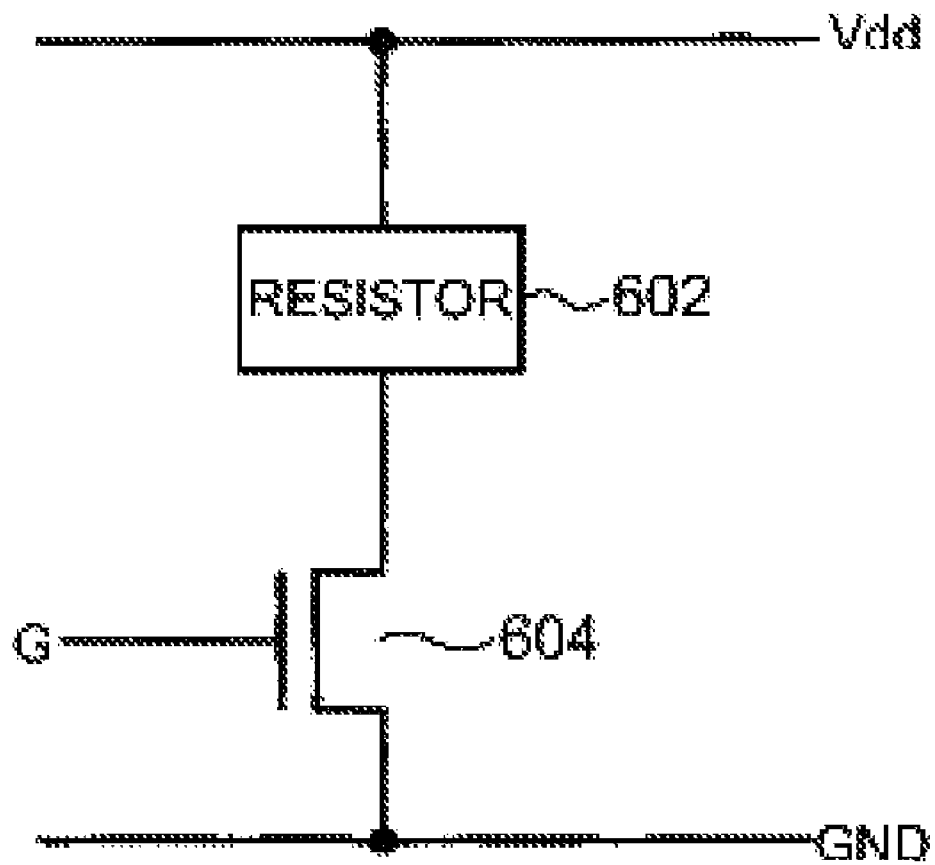
FIG. 6 is a diagram showing an example for a current consumption circuit that includes a resistor and an FET.

FIG. 6 is a diagram showing a circuit 600 that is another example for the current consumption circuit 350, and that is provided by the series connection of a resistor 602 and an FET (a field effect transistor) 604. The resistor 602 can be replaced by a variable resistor that includes a variable-controlled input terminal.

The enable input G is transmitted to the gate terminal of the FET 604, and the FET 604 serves as a switching element that becomes a short-contact switch during a period in which the enable input G is active. That is, during a period in which the enable input G is active, a certain amount of current flows from the power source Vdd, via the resistor 602, to the GND.

Figure 7:
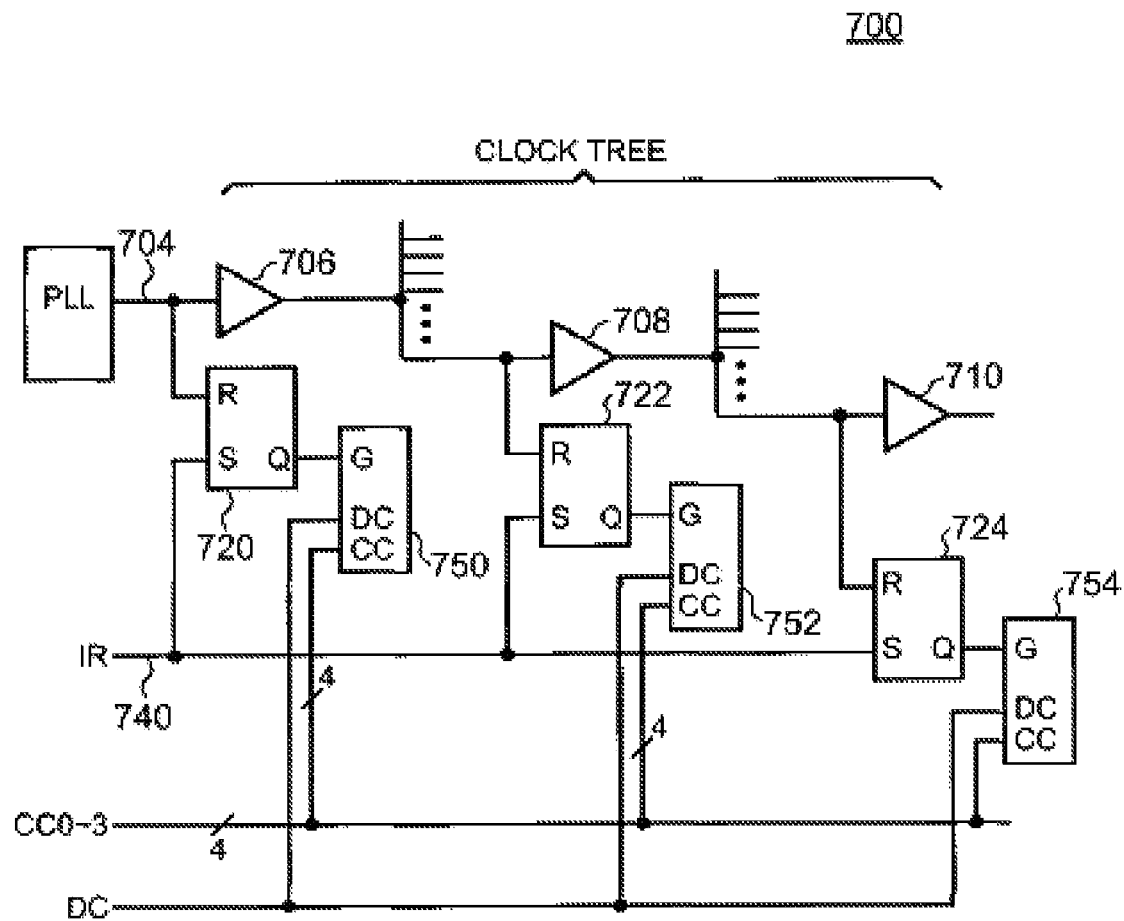
FIG. 7 is a diagram showing the arrangement of a circuit according to a second embodiment of the present invention.

The second embodiment of the present invention will now be described. The internal circuit configuration for an integrated circuit 700 based on the second embodiment is illustrated in FIG. 7.

In the same manner as in the configuration for the first embodiment, set/reset latches 720, 722 and 724, which serve as timing designation circuits, and current consumption circuits 750, 752 and 754 are provided in correspondence with clock buffers 706, 708 and 710, which constitute a clock tree.

Furthermore, as well as in the configuration of the first embodiment, a signal IR 704 is transmitted to a set input terminal S of the set/reset latch 720, an operating clock signal 704, included in the clock tree, that is supplied by a PLL 702 is transmitted to a reset input terminal R, and a latch output Q is transmitted to an enable input terminal G of the current consumption circuit 750.

In the second embodiment, the consumption current circuit 750 includes not only the enable input G but also current control inputs CC0 to CC3, for programmable-control of the amount of currant to be consumed by the consumption current circuit 750 during the operation, and delay control input DC, for programmable-control of the delay of a pulse that is to be oscillated.

Figure 8:
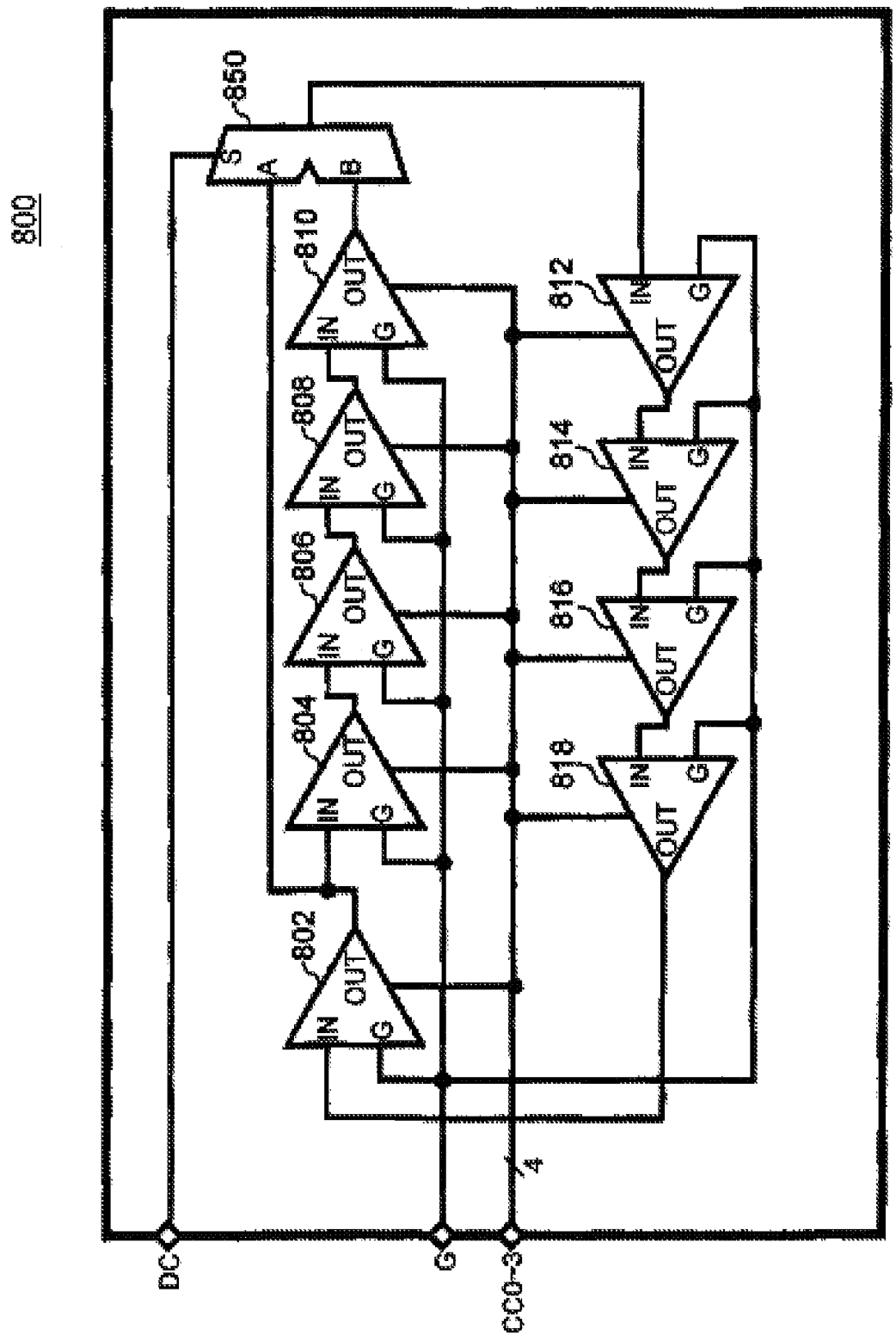
FIG. 8 is a diagram showing the circuit arrangement for a ring-type oscillator, for the second embodiment of the invention, that can perform current control and delay control.

FIG. 8 is a diagram illustrating the circuit configuration for a ring-type oscillator 800 that is an example for the current consumption circuit 700 of the second embodiment of the invention and that can control a current and a delay. Nine special inversion buffers 802 to 818 are connected in a ring-shape arrangement to constitute an oscillation circuit. In a period during which the enable input G is inactive, all of the inversion buffers connected in a ring-shape arrangement are turned on, and begin to output oscillation signals. At this time, since the individual inversion buffers receive current control inputs CC0 to CC3, the amount of current consumed by the individual inversion buffers can be controlled.

The ring-type oscillator 800 also receives the delay control input DC. This delay control input DC is transmitted to a selection input terminal S of a selector 850, and one of two input terminals A and B of the selector 850 is selected. When the input terminal A is selected, the output of the inversion buffer 802 is transmitted to the inversion buffer 812 via the selector 850, and the inversion buffers 804, 806, 808 and 810 are bypassed. That is, the ring-type oscillator 800 is formed by the ring-shape connection of the five inversion buffers 802 and 812 to 814, and compared with the ring-type connection of nine buffers, the oscillation cycle can be shortened, i.e., the oscillation frequency can be increased.

Figure 9:
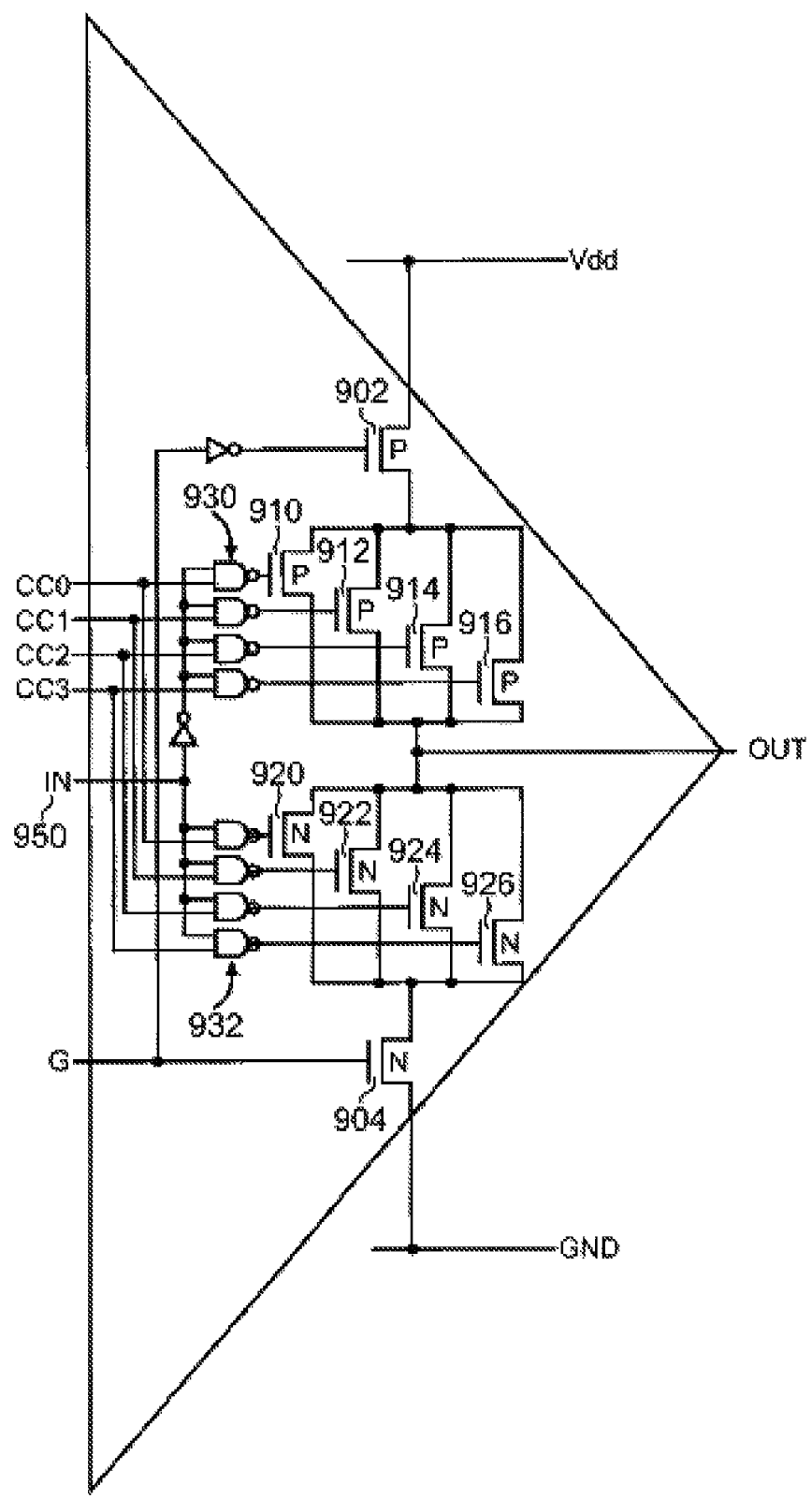
FIG. 9 is a diagram showing an example internal circuit for an inversion buffer.

An example internal circuit for each inversion buffer is shown in FIG. 9. In a period during which the enable input G is inactive (i.e., Low), the gates of a P channel FET 902 and an N channel FET 904 are rendered off, and the inversion buffer is rendered inactive, so that no current is consumed. Then, when the enable input G is active (i.e., High), the gates of the P channel FET 902 and the N channel FET 904 are rendered on.

In this case, when an input IN 950 for the inversion buffer is High, a high voltage from the input IN 950 is applied via, for example, NAND gates 930 to the gates of all the P channel FETs 910 to 916 on the upper stage that are connected in parallel. Therefore, these gates are rendered off. Further, since the input IN 950 is also transmitted via, for example, AND gates 932 to the gates of all the N channel FETs 920 to 926 on the lower stage that are connected in parallel, the values of the individual gates are determined in consonance with the values of the current control inputs CC0 to CC3, which are received at the other input terminals of the AND gates 932. That is, a "High" output is obtained for the AND gate related to the current control inputs CC0 to CC3 that have "High" values, and a "Low" output is obtained for the other AND gate. The gates of N channel FETs, to which the AND gates having "High" outputs are connected, are rendered on and are rendered conductive and permit a current to flow through them. And since the gates of the other N channel FETs are rendered off, almost no current flows through them. As described above, when the gates affected by the current control inputs CC0 to CC3 are employed, the total amount of current that flows across the N channel FETs, on the lower stage, when the input IN is "High" and the output OUT is "Low" can be controlled.

Likewise, when the input IN 950 for the inversion buffer is Low, the gates of all the N channel FETs 920 to 926 on the lower stage, to which the input IN 950 is transmitted via, for example, the AND gates 932, are rendered off. Further, the gates of the P channel FETs 910 to 916 on the upper stage, to which the input IN 950 is transmitted via, for example, the NAND gates 930, are determined in accordance with the values of the current control inputs CC0 to CC3 that are received at the other input terminals of the NAND gates 930. That is, the gates of the P channel FETs, which are connected to the NAND gates related to the current control inputs CC0 to CC3 and have a "High" value, are rendered on, and these FETs are rendered conductive and a current flows through them. The gates of the other P channel FETs are rendered off, and no current flows through them. In this manner, using the current control inputs CC0 to CC3, the total amount of current that flows across the P channel FETs on the upper stage when the input IN is Low and the output OUT is high can be controlled.

Since values for the current control inputs CC0 to CC3 are programmable-controlled in this manner, the total current consumption during the operation of the ring-type oscillator 800 can be adjusted. Further, when a value provided for the delay control input is changed, the oscillation cycle of the ring-type oscillator 800 can also be selected.

The above description has been given for the embodiments wherein a timing designation circuit, provided as a set/reset latch, and a current consumption circuit, provided as a ring-type oscillator, are arranged for each clock buffer in a clock tree. However, the clock buffer and these circuits need not be arranged with a one-to-one correspondence. That is, in the case where the total amount of current consumed when operating clock signals pass through a set of several clock buffers of a clock tree is equal to the total amount of current consumed by one current consumption circuit, one timing designation circuit and one current consumption circuit can be arranged for this set of several clock buffers.

In addition, the timing designation circuit and the current consumption circuit need not be arranged with a one-to-one correspondence. That is, one timing designation circuit can be positioned and used in common for a plurality of current consumption circuits, and the output of this timing designation circuit can be transmitted to the enable input terminals of these current consumption circuits. This arrangement can also be regarded as a mode carried out by this invention.

The present invention has been described by employing the several embodiments; however, the present invention can be carried out by various other embodiments, and the invention cited in the claims is not limited to the embodiments. That is, it will be obvious to one having ordinary skill in the art that the embodiments can be variously modified or altered. It will also be obvious from the claims of the present invention, that such modifications or improvements are also included in the technical scope of the present invention. Furthermore, not all the combinations of characteristics explained in the above embodiments are always necessary as means for solving the problems.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An integrated circuit for testing electronic components, comprising:
    a plurality of clock buffers and a plurality of latches synchronously operated in accordance with operating clock signals distributed via the clock buffers;
    a testing mechanism for performing an At Speed Test to shift data that are initially set for the latches in accordance with the operating clock signals to succeeding latches, respectively;
    a timing designation circuit for generating a first output signal pulse that remains active for a predetermined period and enabling a clock signal pulse generated after said first output signal has been generated but during said period when said first output signal pulse is still active; and
    a current consumption circuit including a ring-type oscillator including a plurality of components, each component having an output connected to an input of the next component in the ring and each component being arranged to produce an output which is inverted in relation to the input thereto, the oscillator being provided in correspondence with each of at least a part of the plurality of clock buffers, the oscillator being operable to consume a certain amount of current in the period during which the first output signal is active, the ring-type oscillator including a delay control input terminal, the oscillation cycle of the ring-type oscillator being selectively adjusted by adjusting an input of the delay control input terminal.

2. The integrated circuit according to claim 1, wherein the timing designation circuit is a set/reset latch having a set input for receiving a signal indicating duration of the predetermined time, said a reset input receiving an additional a signal indicating the time of generation of the operating clock signal, and a latch output activated and deactivated responsive to activation of the set input.

3. The integrated circuit according to claim 1, wherein the ring-type oscillator further includes a current control input terminal, such that amount of the current consumption of the ring-type oscillator can be selectively adjusted by adjusting input to the current control terminal.

4. The integrated circuit according to claim 1 wherein, the timing designation circuit is a set/reset latch having a set input receiving a signal indicating the duration of the predetermined period.

5. The integrated circuit according to claim 4 wherein, the timing designation circuit set/reset latch receives a signal prior to generation of operating clock signal such that a latch output becomes responsively active or inactive based on selective operation of clock signal generation.

6. The integrated circuit according to claim 5 wherein, the current consumption circuit includes a resistor being connected at one end to a power source, and at another end to an FET, the FET being operated during a period in which the latch output is active.

7. The integrated circuit according to claim 6 wherein, the FET is connected at one end to the resistor at its source, is grounded at its drain and is connected to the latch output through its gate.

8. The integrated circuit according to claim 7, wherein the resistor is a variable resistor having a third terminal for controlling a resistance such that said resistance of the variable resistor can be selectively is controlled and/or adjusted by providing an input to the third terminal.

9. The integrated circuit according to claim 1, wherein a signal indicating the duration of the predetermined active period can be further generated in response to the end of a scan-in phase during an initialization stage of the At-Speed Test, for initially setting test data for the individual latches.

10. The integrated circuit according to claim 1 wherein said ring-shape arrangement of said oscillation circuit is comprised of an odd number of NAND gates.

11. The integrated circuit according to claim 10 wherein said NAND gates are off during a period in which the enable input is inactive.

12. The integrated circuit according to claim 11 wherein said NAND gates become active when the enable input is rendered active, causing a certain amount of current to flow from a power source to the ground.

13. The integrated circuit according to claim 1, further comprising a selector coupled to the delay control input terminal, the selector configured to select one of a plurality of outputs from ring-type connections with a different numbers of inversion buffers according to the delay control input terminal.

14. The integrated circuit according to claim 1, wherein the plurality of clock buffers form a clock tree, each stage of the clock tree is coupled to at least one reset terminal of a set/reset latch of the timing designation circuit.

15. A circuit included in an integrated circuit comprising:
a plurality of clock buffers, a plurality of latches synchronously operated in accordance with operating clock signals distributed via the clock buffers, and a mechanism for performing an At Speed Test for the plurality of latches, for controlling power voltage fluctuation during the At Speed Test, the circuit comprising:
a timing designation circuit for generating a first output signal that is active for a predetermined period and enabling an operating clock signal generated prior to time when the At Speed Test is generated and while it remains active; and
a current consumption circuit provided in correspondence with each of at least a part of the plurality of clock buffers, for consuming a certain amount of current in the period during which the first output signal is active;
said current consumption circuit including a ring-type oscillator, in which an odd number of inversion buffers having enable inputs, are connected to one another in a ring-shape structure respectively such that a latch output from each is connected to another buffer as an enabling input, and each inversion buffer is active for a period in which the enable input is active providing an oscillating function, the ring-type oscillator including a delay control input terminal, an oscillation cycle of the ring-type oscillator being selectively adjusted by adjusting an input of the delay control input terminal.

16. The circuit according to claim 15, further comprising a selector coupled to the delay control input terminal, the selector configured to select one of a plurality of outputs from ring-type connections with a different numbers of inversion buffers according to the delay control input terminal.

17. The circuit according to claim 15, wherein the plurality of clock buffers form a clock tree, each stage of the clock tree is coupled to at least one reset terminal of a set/reset latch of the timing designation circuit.

* * * * *